(12) United States Patent
Sugiura

(10) Patent No.: US 9,065,164 B2
(45) Date of Patent: *Jun. 23, 2015

(54) HIGH FREQUENCY SWITCH

(71) Applicant: SAMSUNG ELECTRO-MECHANICS CO., LTD., Suwon, Gyunggi-do (KR)

(72) Inventor: Tsuyoshi Sugiura, Yokohama (JP)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/246,838

(22) Filed: Apr. 7, 2014

(65) Prior Publication Data

US 2014/0218126 A1 Aug. 7, 2014

Related U.S. Application Data

(63) Continuation of application No. 13/355,075, filed on Jan. 20, 2012, now Pat. No. 8,729,948.

(51) Int. Cl.
*H03L 5/00* (2006.01)
*H03K 3/01* (2006.01)
(Continued)

(52) U.S. Cl.
CPC ............. *H01P 1/15* (2013.01); *H03K 17/693* (2013.01); *H01L 27/0629* (2013.01); *H01L 27/1203* (2013.01)

(58) Field of Classification Search
CPC . H03H 11/245; H03H 11/24; H03H 11/1213; H03H 11/1291; H03H 11/04; H03K 17/693; H03K 2217/0018; H03K 19/0016; G05F 3/205; H02M 3/073; H02M 3/07; G11C 5/145
USPC ......... 327/308, 534, 535, 536, 555, 427, 434, 327/437; 455/333
See application file for complete search history.

(56) References Cited

U.S. PATENT DOCUMENTS 7,123,898 B2 10/2006 Burgener et al.
7,890,063 B2 * 2/2011 Ahn et al. .................. 455/78
(Continued)

FOREIGN PATENT DOCUMENTS

JP 2005-515657 A 5/2005
JP 2008-011120 A 1/2008
(Continued)

OTHER PUBLICATIONS

Office Action issued in related Korean Application No. 10-2011-0087273, mailed on Dec. 13, 2012.
(Continued)

*Primary Examiner* — Lincoln Donovan
*Assistant Examiner* — Thomas Skibinski
(74) *Attorney, Agent, or Firm* — McDermott Will & Emery LLP

(57) ABSTRACT

There is provided a high frequency switch which is satisfactory in terms of both insertion loss characteristics and harmonic characteristics. The high frequency switch includes: a common port outputting a transmission signal to an antenna; a plurality of transmission ports each having the transmission signal input thereto; and a plurality of switching units each connected between the plurality of transmission ports and the common port to conduct or block the transmission signal from each of the transmission ports to the common port, wherein each of the switching units includes a plurality of series-connected MOSFETs formed on a silicon substrate, the plurality of MOSFETs are any one of body contact-type FETs and floating body-type FETs, and each of the switching units includes both of the body contact-type FETs and the floating body-type FETs.

6 Claims, 5 Drawing Sheets

(51) Int. Cl.
*H04B 1/28* (2006.01)
*H01P 1/15* (2006.01)
*H03K 17/693* (2006.01)
*H01L 27/06* (2006.01)
*H01L 27/12* (2006.01)

(56) References Cited

U.S. PATENT DOCUMENTS

| | | | |
|---|---|---|---|
| 8,334,718 B2 * | 12/2012 | Granger-Jones et al. | 327/308 |
| 2008/0079653 A1 | 4/2008 | Ahn et al. | |
| 2009/0181630 A1 | 7/2009 | Seshita et al. | |
| 2011/0148501 A1 * | 6/2011 | Granger-Jones et al. | 327/308 |
| 2011/0260773 A1 | 10/2011 | Granger-Jones et al. | |

FOREIGN PATENT DOCUMENTS

| | | |
|---|---|---|
| JP | 2009-124653 A | 6/2009 |
| JP | 2009-158671 A | 7/2009 |
| JP | 2009-194891 A | 8/2009 |
| WO | 03/032431 A2 | 4/2003 |

OTHER PUBLICATIONS

Wang, et al., "High performance SOI RF switches for wireless applications," solid-State and Integrated Circuit Technology (ICSICT), 2010 10th IEEE International Conference, Nov. 1-4, 2010, pp. 611-614.

Chinese Office Action issued in Chinese Application No. 201210018318.3 dated Mar. 26, 2015, with English translation.

* cited by examiner

HIGH FREQUENCY SWITCH

CROSS REFERENCE TO RELATED APPLICATIONS

This application is a continuation of U.S. patent application Ser. No. 13/355,075, filed Jan. 20, 2012, the disclosure of which is incorporated herein by reference.

BACKGROUND OF THE INVENTION

1. Field of the Invention

The present invention relates to a high frequency switch, and more particularly, to a high frequency switch used in a front end portion of a wireless communications apparatus.

2. Description of the Related Art

Recently, a technology for implementing a high frequency switch used in a front end portion of a mobile phone, or the like, by a metal oxide semiconductor field effect transistor (MOSFET) using a silicon on insulator (SOI) process, has been developed.

Generally, a body (a well, a backgate) of the MOSFET using the SOI process is connected to ground potential (hereinafter, a field effect transistor (FET), of which a body is connected to the ground potential, will be referred to a "body contact-type FET") (please refer to Japanese Patent Laid-Open Publication No. 2005-515657).

However, when a high frequency switch is configured to use a body contact-type FET, good harmonic characteristics may be obtained therein; however, insertion loss characteristics are deteriorated, thereby causing difficulty in implementing the high performance of an apparatus.

SUMMARY OF THE INVENTION

An aspect of the present invention provides a high frequency switch having good characteristics in terms of both of insertion loss characteristics and harmonic characteristics through individual switching units being configured to be collectively connected via a common port using a combination of a body contact-type FET and a floating body-type FET (a FET of which a body reaches open circuit potential) having good insertion loss characteristics.

According to an aspect of the present invention, there is provided a high frequency switch including: a common port outputting a transmission signal to an antenna; a plurality of transmission ports each having the transmission signal input thereto; and a plurality of switching units each connected between the plurality of transmission ports and the common port to conduct or block the transmission signal from each of the transmission ports to the common port, wherein each of the switching units includes a plurality of series-connected metal oxide semiconductor field effect transistors (MOSFETs) formed on a silicon substrate, the plurality of MOSFETs are any one of body contact-type FETs and floating body-type FETs, and each of the switching units includes both of the body contact-type FETs and the floating body-type FETs.

That is, the high frequency switch includes each switch unit connected via the common port and being configured using a combination of the body contact type FETs and the floating body type FETs having good insertion loss characteristics.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Hereinafter, a high frequency switch according to an embodiment of the present invention will be described in detail.

Figure 1:
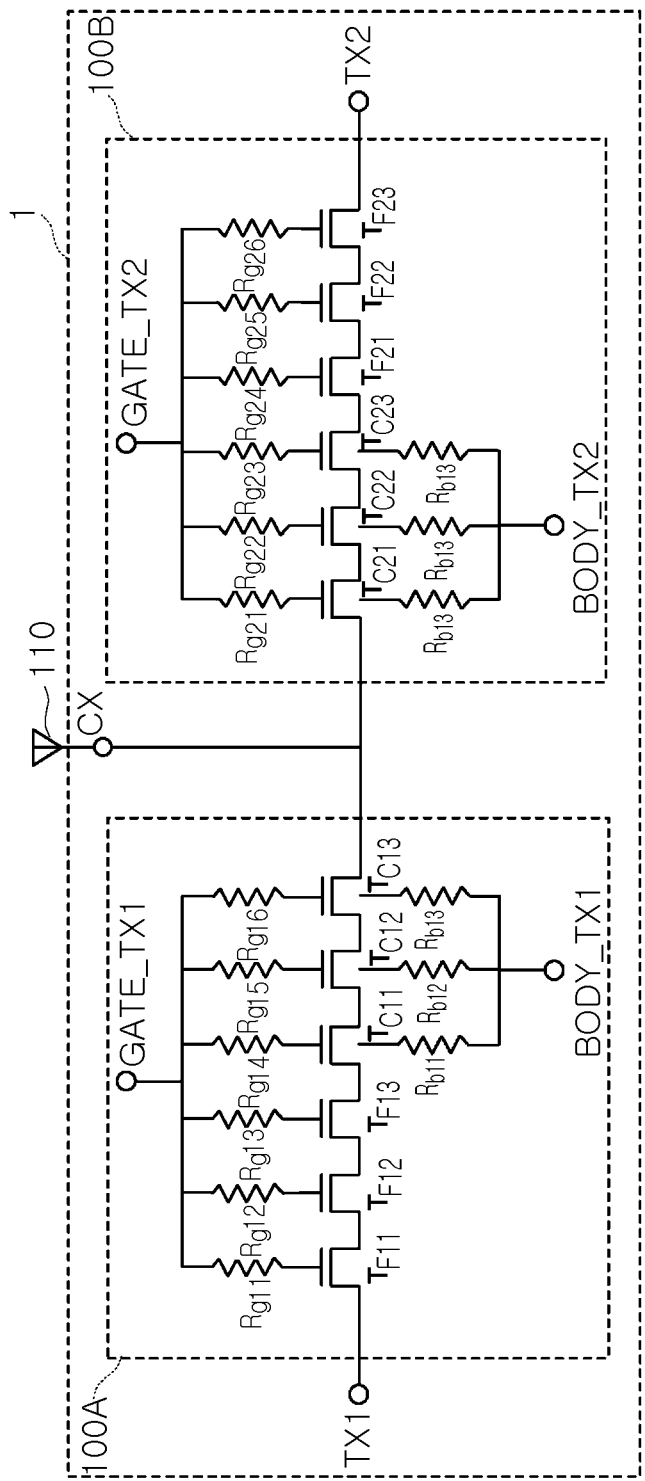
FIG. 1 is a view showing a high frequency switch according to an embodiment of the present invention.

FIG. 1 is a view showing a high frequency switch according to an embodiment of the present invention.

A high frequency switch is generally used in a front end portion of a wireless communications apparatus and has a function of performing port switching according to at least one of transmission and reception switching, a change of a transmission scheme, and switching of a transmission scheme.

FIG. 1 is a view showing a single pole double throw (SPDT) high frequency switch according to the present embodiment. The high frequency switch according to the present embodiment may be a transmission-side single pole double throw (SPDT) high frequency switch performing port switching according to the switching of the transmission scheme. That is, the high frequency switch according to the present embodiment may perform the switching (for example, switching between 850 MHz (a narrow band) and 1900 MHz (a wide band)) of a frequency band in a GSM terminal.

As shown in FIG. 1, the high frequency switch 1 may include first and second switching units 100A and 100B connected in common with (in parallel with) an antenna 110 through a common port CX.

The first switching unit 100A may be set to have a conductive state and a non-conductive state according to a control signal input to a first common gate terminal GATE_TX1. The first switching unit 100A may conduct or block a first transmission signal (for example, a transmission signal of 850 MHz) input to a first transmission port TX1 to the antenna 110 through the common port CX.

The second switching unit 100B may be set to have a conductive state and a non-conductive state according to a control signal input to a second common gate terminal GATE_TX2. The second switching unit 100B may conduct or block a second transmission signal (for example, a transmission signal of 1900 MHz) input to a second transmission port TX2 to the antenna 110 through the common port CX.

That is, any one of the first switching unit 100A and the second switching unit 100B is set to have a conductive state while the other is set to have a non-conductive state, whereby the high frequency switch 1 may perform the switching of the transmission port. Hereinafter, a switching unit in a conductive state refers to a switching unit of an on-port, and a switching unit in a non-conductive state refers to a switching unit of an off-port.

The first switching unit 100A may include a plurality of series-connected MOSFETs $T_{C11}$ to $T_{C13}$ and $T_{F11}$ to $T_{F13}$. The number of MOSFETs configuring the first switching unit 100A may be appropriately changed by withstand voltage required in the high frequency switch 1. Here, each of the MOSFETs $T_{C11}$ to $T_{C13}$ and $T_{F11}$ to $T_{F13}$ has a source terminal and a drain terminal, indistinguishable from each other on a structure of the MOSFET. Therefore, in the present specification, the "series-connected" MOSFETs mean that any one of a source terminal and a drain terminal of one MOSFET is connected to any one of a source terminal and a drain terminal of another MOSFET. In addition, each of the MOSFETs $T_{C11}$ to $T_{C13}$ and $T_{F11}$ to $T_{F13}$ will be described as an n-type MOSFET.

Figure 2:
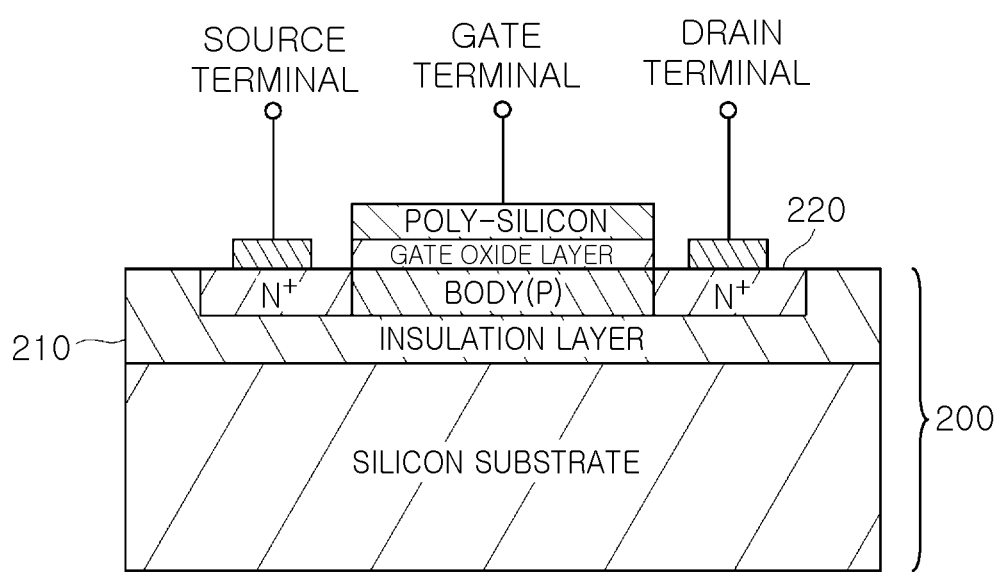
FIG. 2 is a cross-sectional view showing a structure of a metal oxide semiconductor field effect transistor (MOSFET) configuring a high frequency switch according to an embodiment of the present invention.

FIG. 2 is a cross-sectional view showing a structure of a MOSFET configuring the high frequency switch according to the embodiment of the present invention.

As shown in FIG. 2, the MOSFETs $T_{C11}$ to $T_{C13}$ and $T_{F11}$ to $T_{F13}$ may be formed on a silicon on insulator (SOI) substrate. The MOSFETs $T_{C11}$ to $T_{C13}$ and $T_{F11}$ to $T_{F13}$ formed on the SOI substrate 200 may have a structure in which MOSFET devices formed on a silicon layer 220 disposed on an insulation layer 210 formed of a silicon oxide ($SiO_2$) are enclosed by the insulation layer 210 and may be electrically separated from each other by the insulation layer 210.

The MOSFETs $T_{C11}$ to $T_{C13}$, among the MOSFETs $T_{C11}$ to $T_{C13}$ and $T_{F11}$ to $T_{F13}$ configuring the first switching unit 100A, connected to the common port CX in positions adjacent thereto, may have bodies grounded through body resistors $R_{b11}$ to $R_{b13}$. That is, the MOSFETs $T_{C11}$ to $T_{C13}$ may be a body contact-type FET. The body resistors $T_{b11}$ to $R_{b13}$ are provided in order to reduce loss due to power leaked from a body region.

Meanwhile, voltage is not applied to bodies of the MOSFETs $T_{F11}$ to $T_{F13}$, among the MOSFETs $T_{C11}$ to $T_{C13}$ and $T_{F11}$ to $T_{F13}$ configuring the first switching unit 100A, connected to the common port CX in positions distant therefrom, such that the bodies of the MOSFETs $T_{F11}$ to $T_{F13}$ reaches an open circuit potential. That is, the MOSFETs $T_{F11}$ to $T_{F13}$ may be a floating body-type FET.

In addition, gate resistors $R_{g11}$ to $R_{g16}$ may be individually provided between gate terminals of the MOSFETs $T_{C11}$ to $T_{C13}$ and $T_{F11}$ to $T_{F13}$ and the first common gate terminal GATE_TX1.

The second switching unit 100B also has the same structure as that of the first switching unit 100A. Therefore, a description thereof will be briefly described or be omitted.

The second switching unit 100B may include a plurality of series-connected MOSFETs $T_{C21}$ to $T_{C23}$ and $T_{F21}$ to $T_{F23}$ and each of the MOSFETs $T_{C21}$ to $T_{C23}$ and $T_{F21}$ to $T_{F23}$ may be formed on the SOI substrate 200.

The MOSFETs $T_{C21}$ to $T_{C23}$, among the MOSFETs $T_{C21}$ to $T_{C23}$ and $T_{F21}$ to $T_{F23}$ configuring the second switching unit 100B, connected to the common port CX in positions adjacent thereto, may be a body contact-type FET and have bodies grounded through body resistors $R_{b21}$ to $R_{b23}$. Meanwhile, the MOSFETs $T_{F21}$ to $T_{F23}$, connected to the common port CX in positions distant therefrom, may be a floating body-type FET.

In addition, gate resistors $R_{g21}$ to $R_{g26}$ may be individually provided between gate terminals of the MOSFETs $T_{C21}$ to $T_{C23}$ and $T_{F21}$ to $T_{F23}$ and the second common gate terminal GATE_TX2.

An operation of the high frequency switch 1 according to the present embodiment will be described.

A case in which the first switching unit 100A is an on-port and the second switching unit 100B is an off-port will be described. In addition, a case in which the first switching unit 100A is an off-port and the second switching unit 100B is an on-port may also be considered (a description of this case will be omitted).

When a high level control signal is input to the first common gate terminal GATE_TX1, all of the MOSFETs $T_{C11}$ to $T_{C13}$ and $T_{F11}$ to $T_{F13}$ of the first switching unit 100A are conductive. Therefore, the first switching unit 100A is switched on, such that the first transmission signal input to the first transmission port TX1 is transferred to the antenna 110 through the common port CX.

At this time, since a low level control signal is input to the second common gate terminal GATE_TX2, all of the MOSFETs $T_{C21}$ to $T_{C23}$ and $T_{F21}$ to $T_{F23}$ of the second switching unit 100B are switched to a non-conductive state. Therefore, since the second switching unit 100B is switched off, even in the case in which a signal is input to the second transmission port, the signal is not transferred to the antenna 110 through the common port CX.

The high frequency switch 1 according to the present embodiment may perform the switching of the transmission port by the above-mentioned operation.

Figure 3:
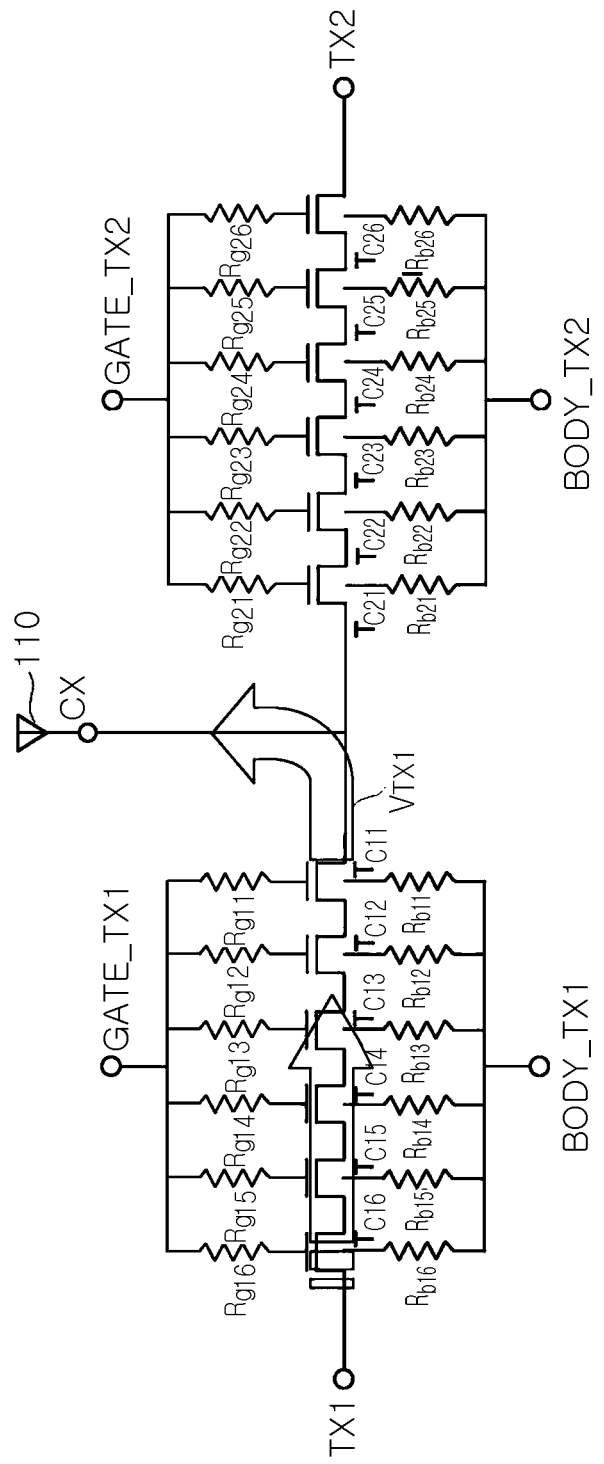
FIG. 3 is a view showing a high frequency switch according to the related art in which each MOSFET configuring a switching unit is formed of a body contact-type FET.

FIG. 3 is a view showing a high frequency switch according to the related art in which each MOSFET configuring a switching unit is formed of a body contact-type FET.

In the case of the high frequency switch according to the related art shown in FIG. 3, with regard to transmission characteristics, harmonic characteristics from the first transmission port TX1 to the common port CX are satisfactory; however, insertion loss characteristics are deteriorated. Since the insertion loss characteristics may directly affect power amplifier efficiency, additional improvements are required. However, it is relatively difficult to satisfy specifications required in order to implement high performance in an apparatus with the related art high frequency switch shown in FIG. 3.

Figure 4:
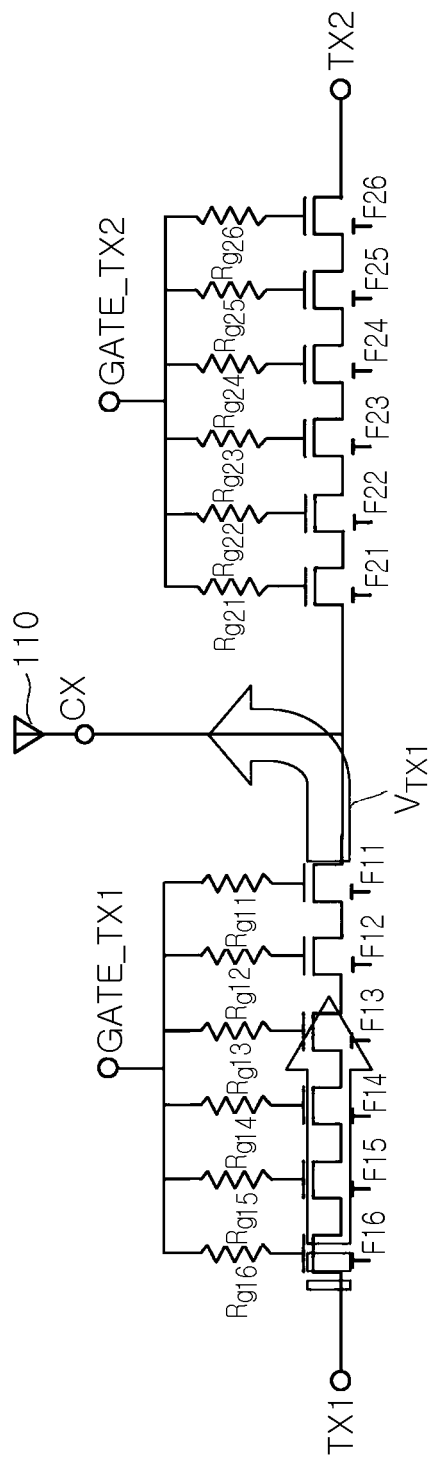
FIG. 4 is a view showing a high frequency switch in which each MOSFET configuring a switching unit is formed of a floating body-type FET.

FIG. 4 is a view showing a high frequency switch in a case in which each MOSFET configuring a switching unit is formed of a floating body-type FET.

The high frequency switch shown in FIG. 4 includes a floating body-type FET having relatively good loss characteristics in a device unit. Therefore, insertion loss characteristics from the first transmission port TX1 to the common port CX are satisfactory. However, in the high frequency switch including the floating body-type FET, harmonic characteristics are deteriorated.

That is, a first transmission signal $V_{TX1}$ output to the common port CX through the first switching unit 100A is also applied to the second switching unit 100B connected, together with the first switching unit 100A, to the common port CX. In this case, the first transmission signal $V_{TX1}$ output to the common port CX through the first switching unit 100A of an on-port, is affected by characteristics (characteristics at the time of the transistor off state) of MOSFETs $T_{F21}$ to $T_{F26}$ configuring the second switching unit 100B of an off-port. In addition, in the case in which the second switching unit is formed of a floating body-type FET, since an influence of the second switching unit of the off-port on harmonic characteristics of the first transmission signal output to the common port becomes relatively large, harmonic characteristics of the high frequency switch 1 are deteriorated.

In addition, when the first switching unit 100A is switched off, the second switching unit 100B is switched on, such that both of the switching units generally required to have the same configuration.

Figure 5:
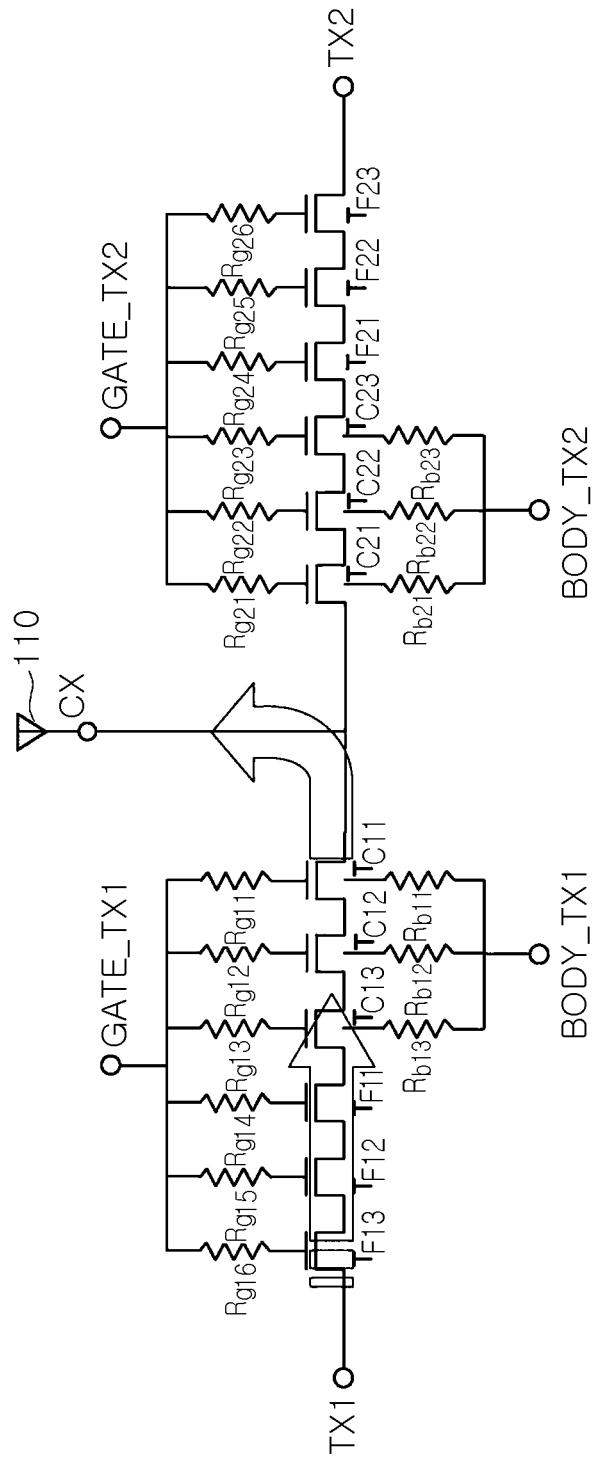
FIG. 5 is a view describing characteristics of a high frequency switch according to an embodiment of the present invention.

FIG. 5 is a view describing characteristics of a high frequency switch according to an embodiment of the present invention.

As shown in FIG. 5, the high frequency switch 1 according to the present embodiment may include the first and second switching units 100A and 100B, in which the MOSFETs $T_{C11}$ to $T_{C13}$ and $T_{C21}$ to $T_{C23}$, among the MOSFETs configuring the respective switching units 100A and 100B, connected to the common port CX in positions adjacent thereto, may be formed of a body contact-type FET, and the remaining MOSFETs $T_{F11}$ to $T_{F13}$ and $T_{F21}$ to $T_{F23}$ may be formed of a floating body-type FET.

Since parasitic capacitance components and parasitic resistance components are present in the plurality of MOSFETs configuring each switching unit 100A and 100B, voltage applied to each MOSFET may not be evenly divided. That is, voltage applied to the MOSFETs $T_{C11}$ to $T_{C13}$ and $T_{C21}$ to $T_{C23}$, among the series-connected MOSFETs of each switching unit 100A and 100B, connected to the common port CX in positions adjacent thereto, becomes relatively large.

Therefore, an influence of the MOSFETs $T_{C21}$ to $T_{C23}$ and $T_{F21}$ to $T_{F23}$ configuring the second switching unit 100B, which is the off-port side, on harmonic characteristics of the first transmission signal $V_{TX1}$ output to the common port CX becomes relatively large in the MOSFETs adjacent to the common port CX.

Therefore, each switching unit 100A and 100B has the body contact-type FETs connected to the common port CX in the positions adjacent thereto, whereby deterioration in the insertion loss characteristics of the high frequency switch 1 may be effectively prevented. Further, in each switching unit 100A and 100B, FETs other than the body contact-type FETs are formed of the floating body-type FETs, whereby the insertion loss characteristics of the high frequency switch 1 may be improved.

The high frequency switch according to the embodiment of the present invention has the following effects. That is, each switching unit connected via the common port is configured using a combination of the body contact-type FETs and the floating body-type FETs having good insertion loss characteristics, whereby a high frequency switch having good characteristics in terms of both insertion loss characteristics and harmonic characteristics may be realized.

The present invention is not limited to the high frequency switch according to the above-described embodiments. That is, a high frequency switch according to an embodiment of the present invention may be a transmission and reception single pole 4 throw (SP4T) high frequency switch performing port switching according to the switching of the transmission and reception scheme. In addition, a high frequency switch according to an embodiment of the present invention may also be a single pole multi throw (SPMT) switch and a multi pole multi throw (MPMT).

In addition, any one of the MOSFETs configuring each switching unit may be formed of the floating body-type FET, and a ratio of the body contact-type FETs to the floating body-type FETs and a connection position therebetween are not limited.

Further, the MOSFETs of each switching unit are not limited to the n-type MOSFET, but may also be a p-type MOSFET.

In addition, the MOSFET is not limited to being formed on the SOI substrate, but may also be formed on a general silicon substrate.

As set forth above, according to embodiments of the present invention, a high frequency switch which is satisfactory in terms of both harmonic characteristics and insertion loss characteristics may be realized.

While the present invention has been shown and described in connection with the embodiments, it will be apparent to those skilled in the art that modifications and variations can be made without departing from the spirit and scope of the invention as defined by the appended claims.

What is claimed is:

1. A high frequency switch comprising:
   a common port receiving and transmitting a high frequency signal through an antenna;
   a first switching unit including at least one first floating body-type switch and at least one first body contact-type switch connected in series and allowing the high frequency signal to be conducted or preventing the high frequency signal from being conducted to a signal path between a first port receiving and transmitting the high frequency signal and the common port; and
   a second switching unit including at least one second floating body-type switch and at least one second body contact-type switch connected in series and allowing the high frequency signal to be conducted or preventing the high frequency signal from being conducted to a signal path between a second port receiving and transmitting the high frequency signal and the common port,
   wherein at least one of the first body contact-type switch or the second body contact-type switch is connected to the common port in a position closer than at least one of the first floating body-type switch or at least one of the second floating body-type switch, respectively.

2. The high frequency switch of claim 1,
   wherein the first body contact-type switch is connected to the common port in a position closer than that of the first floating body-type switch, and
   the second body contact-type switch is connected to the common port in a position closer than that of the second floating body-type switch.

3. The high frequency switch of claim 1, wherein the first and second body contact-type switches and the first and second floating body-type switches are field effect transistors (FETs).

4. The high frequency switch of claim 1, wherein a body terminal of the first body contact-type switch is grounded through a first body resistor, and
   a body terminal of the second body contact-type switch is grounded through a second body resistor.

5. The high frequency switch of claim 1, wherein the first and second body contact-type switches and the first and second floating body-type switches are formed on a silicon substrate.

6. The high frequency switch of claim 5, wherein the silicon substrate is a silicon-on-insulator (SOI) substrate.

* * * * *